United States Patent
Cernatescu et al.

(10) Patent No.: US 10,370,984 B2
(45) Date of Patent: Aug. 6, 2019

(54) ALUMINUM ALLOY AIRFOIL WITH DESIGNED CRYSTALLOGRAPHIC TEXTURE

(71) Applicant: United Technologies Corporation, Farmington, CT (US)

(72) Inventors: Iuliana Cernatescu, Glastonbury, CT (US); Thomas J. Watson, South Windsor, CT (US); James O. Hansen, Glastonbury, CT (US); David Ulrich Furrer, Marlborough, CT (US); Randy P. Salva, Baltic, CT (US)

(73) Assignee: UNITED TECHNOLOGIES CORPORATION, Farmington, CT (US)

(*) Notice: Subject to any disclaimer, the term of this patent is extended or adjusted under 35 U.S.C. 154(b) by 467 days.

(21) Appl. No.: 15/100,663

(22) PCT Filed: Nov. 19, 2014

(86) PCT No.: PCT/US2014/066261
§ 371 (c)(1),
(2) Date: Jun. 1, 2016

(87) PCT Pub. No.: WO2015/122947
PCT Pub. Date: Aug. 20, 2015

(65) Prior Publication Data
US 2016/0305255 A1 Oct. 20, 2016

Related U.S. Application Data

(60) Provisional application No. 61/912,824, filed on Dec. 6, 2013.

(51) Int. Cl.
*F01D 5/28* (2006.01)
*C30B 29/52* (2006.01)
*F01D 5/14* (2006.01)

(52) U.S. Cl.
CPC ............ *F01D 5/28* (2013.01); *C30B 29/52* (2013.01); *F01D 5/147* (2013.01);
(Continued)

(58) Field of Classification Search
CPC ........ F01D 5/28; F04D 29/325; F04D 29/388; F05D 2220/36; F05D 2250/74; F05D 2300/605
See application file for complete search history.

(56) References Cited

U.S. PATENT DOCUMENTS 3,346,427 A * 10/1967 Baldwin, Jr. ........... C22C 32/00
148/426
4,518,442 A * 5/1985 Chin ....................... C30B 29/52
148/675
(Continued)

FOREIGN PATENT DOCUMENTS

| EP | 2623723 | 8/2013 |
| EP | 2623726 | 8/2013 |

OTHER PUBLICATIONS

International Preliminary Report on Patentability for PCT Application No. PCT/US2014/066261 dated Jun. 16, 2016.
(Continued)

*Primary Examiner* — Ninh H. Nguyen
(74) *Attorney, Agent, or Firm* — Carlson, Gaskey & Olds, P.C.

(57) ABSTRACT

An airfoil includes an airfoil body that extends at least between leading and trailing edges, first and second sides, and radially inner and outer ends. The airfoil body includes an aluminum alloy that has a controlled crystallographic texture with respect to a predefined three-dimensional coordinate system. The airfoil can be used in the fan of a gas turbine engine.

17 Claims, 2 Drawing Sheets

(52) U.S. Cl.
CPC ...... *F05D 2220/36* (2013.01); *F05D 2250/74* (2013.01); *F05D 2300/173* (2013.01); *F05D 2300/605* (2013.01); *Y02T 50/673* (2013.01)

(56) References Cited

U.S. PATENT DOCUMENTS

| | | | |
|---|---|---|---|
| 4,529,452 A | | 7/1985 | Walker |
| 4,605,452 A | * | 8/1986 | Gemma .................. C30B 11/00 148/404 |
| 5,843,586 A | | 12/1998 | Schaeffer et al. |
| 6,004,101 A | * | 12/1999 | Schilling .................. F01D 5/28 416/219 R |
| 7,338,259 B2 | * | 3/2008 | Shah ...................... C22C 19/056 148/404 |
| 8,434,543 B2 | * | 5/2013 | Morris .................... F01D 5/284 164/122.1 |
| 2003/0017270 A1 | | 1/2003 | Strangman et al. |
| 2005/0196268 A1 | | 9/2005 | Shah et al. |
| 2011/0211965 A1 | | 9/2011 | Deal et al. |
| 2011/0253266 A1 | | 10/2011 | Bush et al. |
| 2013/0004327 A1 | | 1/2013 | Watson et al. |
| 2013/0008170 A1 | | 1/2013 | Gallagher et al. |
| 2013/0078103 A1 | | 3/2013 | McKaveney et al. |
| 2013/0171020 A1 | | 7/2013 | Bullied et al. |
| 2013/0216368 A1 | | 8/2013 | Morris et al. |

OTHER PUBLICATIONS

Supplementary European Search Report for European Patent Application No. 14882461 dated Sep. 7, 2017.
International Search Report for PCT Application No. PCT/US2014/066261 dated Aug. 21, 2015.

\* cited by examiner

US 10,370,984 B2

ALUMINUM ALLOY AIRFOIL WITH DESIGNED CRYSTALLOGRAPHIC TEXTURE

CROSS-REFERENCE TO RELATED APPLICATION

This application claims priority to U.S. Provisional Application No. 61/912,824, filed Dec. 6, 2013.

BACKGROUND

A gas turbine engine typically includes a fan section, a compressor section, a combustor section and a turbine section. Air entering the compressor section is compressed and delivered into the combustion section where it is mixed with fuel and ignited to generate a high-speed exhaust gas flow. The high-speed exhaust gas flow expands through the turbine section to drive the compressor and the fan section. The fan section includes fan blades that rotate to provide thrust.

SUMMARY

An airfoil according to an example of the present disclosure includes an airfoil body extending at least between leading and trailing edges, first and second sides, and radially inner and outer ends. The airfoil body includes an aluminum alloy having a controlled crystallographic texture with respect to a predefined three-dimensional coordinate system.

In a further embodiment of any of the foregoing embodiments, the three-dimensional coordinate system has an axis extending in a radial direction with respect to the radially inner and outer ends.

In a further embodiment of any of the foregoing embodiments, the controlled crystallographic texture includes 20 to 100% of crystallites by volume oriented of a high strength crystal direction within 10° radius of an axis of the predefined three-dimensional coordinate system.

In a further embodiment of any of the foregoing embodiments, the high strength crystal direction is selected from the group consisting of <111>, <112> and <110>.

In a further embodiment of any of the foregoing embodiments, the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the controlled crystallographic texture includes an orientation of a selected crystal direction within a cone of 10° of the Z-axis.

In a further embodiment of any of the foregoing embodiments, the selected crystal direction is selected from the group consisting of <111>, <112>, <110>, and combinations thereof.

In a further embodiment of any of the foregoing embodiments, the predefined three-dimensional coordinate system is a Cartesian coordinate system having a Z-axis extending along a radial direction of the airfoil body, an X-axis extending in a direction traverse to the first and second sides, and a Y-axis extending orthogonally to the Z-axis and the X-axis, and the controlled crystallographic texture includes orientations of at least one of crystal directions <111>, <112> and <110> within 10° with respect to at least one of the axes of the Cartesian coordinate system.

In a further embodiment of any of the foregoing embodiments, the controlled crystallographic texture defines a texture distribution with respect to volume fractions of textures.

In a further embodiment of any of the foregoing embodiments, the texture distribution includes 20% to 100%, by volume, of a defined texture.

In a further embodiment of any of the foregoing embodiments, the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the texture distribution includes 30% to 70%, by volume, of a first texture, the first texture being defined by a {111} type of crystallographic plane being parallel within +/−10° of the X-Y, X-Z or Z-Y plane of the Cartesian coordinate system and a <1-10> type of crystallographic direction being oriented within a cone of 10° of one of the axes of the Cartesian coordinate system.

In a further embodiment of any of the foregoing embodiments, the texture distribution further includes 30% to 70%, by volume, of a second texture, the second texture being defined by a {111} type of crystallographic plane being parallel within +/−10° of the X-Y, X-Z or Z-Y plane of the Cartesian coordinate system and a <−110> type of crystallographic direction being oriented within a cone of 10° of one of the axes of the Cartesian coordinate system.

In a further embodiment of any of the foregoing embodiments, the texture distribution further includes less than 40%, by volume, of a third texture, the third texture being defined by a {100} crystallographic plane being parallel within +/−10° of the X-Y, X-Z or Z-Y plane of the Cartesian coordinate system and a <001> crystallographic direction being oriented within a cone of 10° of one of the axes of the Cartesian coordinate system.

A gas turbine engine according to an example of the present disclosure includes a fan, a compressor section, a combustor in fluid communication with the compressor section, and a turbine section in fluid communication with the combustor. The fan includes an airfoil having an airfoil body extending at least between a leading edge and a trailing edge, a first side and a second side, and a radially inner end and a radially outer end. The airfoil body includes an aluminum-based metallic material having a controlled crystallographic texture with respect to a predefined three-dimensional coordinate system.

In a further embodiment of any of the foregoing embodiments, the controlled crystallographic texture includes an orientation of a high strength crystal direction within 10° of an axis of the predefined three-dimensional coordinate system.

In a further embodiment of any of the foregoing embodiments, the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the controlled crystallographic texture includes an orientation of a selected crystal direction within a cone of 10° of the Z-axis.

In a further embodiment of any of the foregoing embodiments, the selected crystal direction is selected from the group consisting of <111>, <112>, <110>, and combinations thereof.

In a further embodiment of any of the foregoing embodiments, the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the controlled crystallographic texture includes orientations of at least one of crystal directions <111>, <112> and <110> within a cone of 10° with respect to at least one of the axes of the Cartesian coordinate system.

In a further embodiment of any of the foregoing embodiments, the controlled crystallographic texture defines a texture distribution with respect to volume fractions of texture components.

In a further embodiment of any of the foregoing embodiments, the texture components distribution includes 20% to 100%, by volume, of a defined texture.

In a further embodiment of any of the foregoing embodiments, the predefined three-dimensional coordinate system is a Cartesian coordinate system having a Z-axis extending along a radial direction of the airfoil body, an X-axis extending in a direction traverse to the first and second sides, and a Y-axis extending orthogonally to the Z-axis and the X-axis, and the texture component distribution includes:

30% to 70%, by volume, of a first texture components, the first texture component being defined by a {111} crystallographic plane of the crystallites in this component being parallel within +/−10° of the X-Y, X-Z or Z-Y plane of the Cartesian coordinate system and a <1-10> type of crystallographic direction of the crystallites in this component being oriented within a cone of 10° radius of one of the axes of the Cartesian coordinate system, 30% to 70%, by volume, of a second texture component, the second texture component being defined by a {111} crystallographic plane of the crystallites in this component being parallel within +/−10° of the X-Y, X-Z or Z-Y plane of the Cartesian coordinate system and a <−110> type of crystallographic direction of the crystallites in this component being oriented within a cone of 10° radius of one of the axes of the Cartesian coordinate system, and less than 40%, by volume, of a third texture component, the third texture component being defined by a {100} type of crystallographic plane of the crystallites in this component being parallel within +/−10° of the X-Y, X-Z or Z-Y plane of the Cartesian coordinate system and a <001> type of crystallographic direction of the crystallites in this component being oriented within a cone of 10° of one of the axes of the Cartesian coordinate system.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
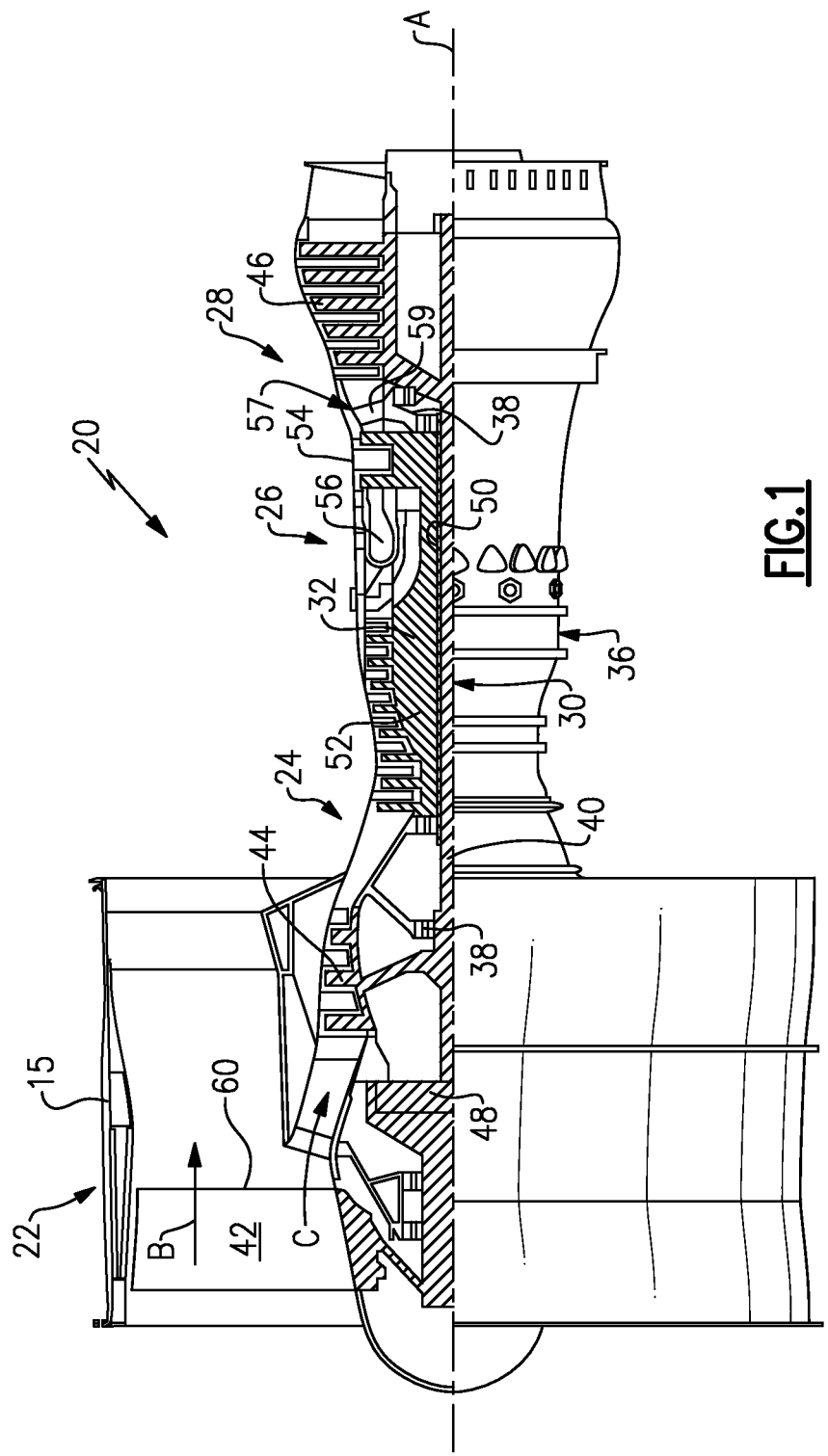
FIG. 1 illustrates an example gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram° R)/(518.7° R)]^{0.5}$. The "Low corrected fan tip speed" as disclosed herein according to one non-limiting embodiment is less than about 1150 ft/second.

Figure 2:
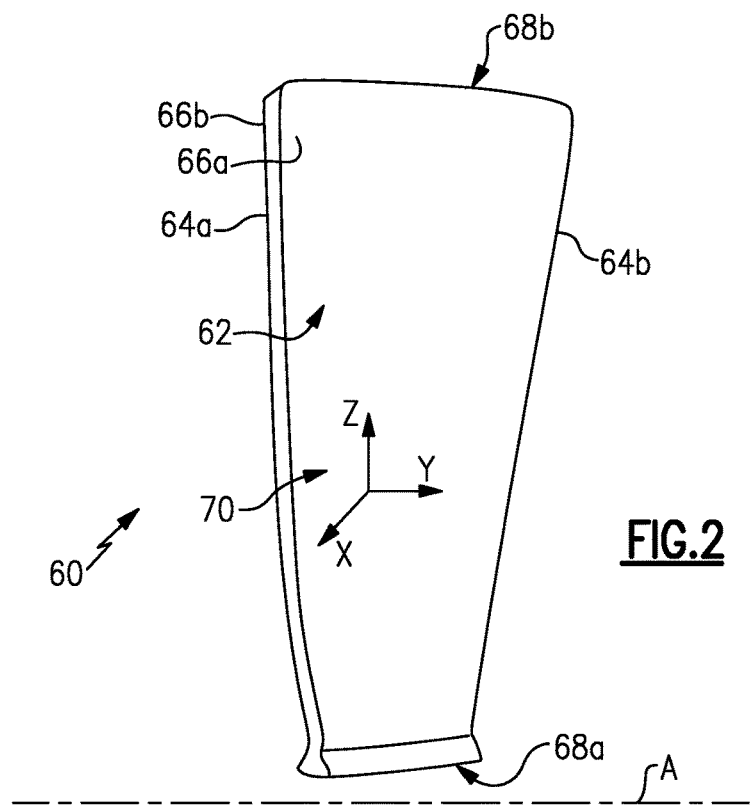
FIG. 2 illustrates an example airfoil that can be used in the gas turbine engine of FIG. 1, with an example coordinate system that can be used to define crystallographic texture components.

The fan 42 of the fan section 22 includes a plurality of circumferentially-spaced airfoils 60. The airfoils 60 can be hollow or solid, and can be made entirely or partially of the aluminum alloy discussed in further detail below. For example, the airfoils 60 can be fan blades that are rotatable about the central engine axis A, although the examples herein are not limited to rotatable fan blades. FIG. 2 illustrates a representative example of one of the airfoils 60. The airfoil 60 includes an airfoil body 62 that extends at least between leading and trailing edges 64a/64b, first and second sides 66a/66b, and radially inner and outer ends 68a/68b (with respect to the normal orientation of the airfoil 60 relative to the central engine axis A). Depending on design requirements, the airfoil 60 can also include other geometric features, such as but not limited to, inner and/or outer platforms and circumferential spacing features. FIG. 2 also shows an example coordinate system that can be used to define crystallographic texture components with respect to the airfoil 60.

Figure 3:
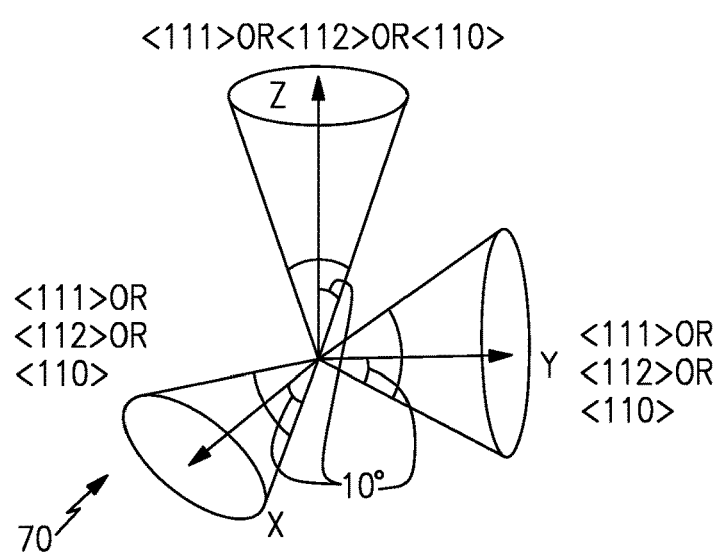
FIG. 3 illustrates crystallographic texture components oriented with respect to a three-dimensional coordinate system of the airfoil shown in FIG. 2.

The airfoil body 62 includes an aluminum alloy that has a controlled crystallographic texture (components volume fraction and sharpness) represented in FIG. 3, with respect to a predefined three-dimensional coordinate system 70. A polycrystalline aluminum alloy that has fully random crystalline grain orientations has no crystallographic texture. A "controlled crystallographic texture" refers to at least one selected crystallographic direction being preferentially oriented with respect to the predefined three-dimensional coordinate system 70. As used herein, reference to crystallographic directions or planes also refers to all directions and planes that are equivalent by symmetry, as understood in Miller index notation. Example crystallographic texture components in the airfoil 60 can include 20-100% of the crystallites by volume fraction being aligned according to one of the following examples:

<111> type of crystallographic direction is within 0 to 10 degrees of the Z axis and <110> type of crystallographic direction is within 0 to 10 degrees of X axis and <112> type of crystallographic direction is within 0 to 10 degrees of Y axis.

<111> type of crystallographic direction is within 0 to 10 degrees of the Z axis and <112> type of crystallographic direction is within 0 to 10 degrees of X axis and <110> type of crystallographic direction is within 0 to 10 degrees of Y axis.

<110> type of crystallographic direction is within 0 to 10 degrees of the Z axis and <111> type of crystallographic direction is within 0 to 10 degrees of X axis and <112> type of crystallographic direction is within 0 to 10 degrees of Y axis.

<110> type of crystallographic direction is within 0 to 10 degrees of the Z axis and <112> type of crystallographic direction is within 0 to 10 degrees of X axis and <111> type of crystallographic direction is within 0 to 10 degrees of Y axis.

<112> type of crystallographic direction is within 0 to 10 degrees of the Z axis and <111> type of crystallographic direction is within 0 to 10 degrees of X axis and <110> type of crystallographic direction is within 0 to 10 degrees of Y axis.

<112> type of crystallographic direction is within 0 to 10 degrees of the Z axis and <110> type of crystallographic direction is within 0 to 10 degrees of X axis and <111> type of crystallographic direction is within 0 to 10 degrees of Y axis.

Further, 0 to 40% of the crystallites by volume fraction can be aligned according to one of the following examples:

<100> type of crystallographic direction is within 0 to 10 degrees of the Z axis and <010> type of crystallographic direction is within 0 to 10 degrees of X axis and <001> type of crystallographic direction is within 0 to 10 degrees of Y axis.

<100> type of crystallographic direction is within 0 to 10 degrees of the Z axis and <001> type of crystallographic direction is within 0 to 10 degrees of X axis and <010> type of crystallographic direction is within 0 to 10 degrees of Y axis.

<010> type of crystallographic direction is within 0 to 10 degrees of the Z axis and <001> type of crystallographic direction is within 0 to 10 degrees of X axis and <100> type of crystallographic direction is within 0 to 10 degrees of Y axis.

<010> type of crystallographic direction is within 0 to 10 degrees of the Z axis and <100> type of crystallographic direction is within 0 to 10 degrees of X axis and <001> type of crystallographic direction is within 0 to 10 degrees of Y axis.

<001> type of crystallographic direction is within 0 to 10 degrees of the Z axis and <001> type of crystallographic direction is within 0 to 10 degrees of X axis and <010> type of crystallographic direction is within 0 to 10 degrees of Y axis.

<001> type of crystallographic direction is within 0 to 10 degrees of the Z axis and <010> type of crystallographic direction is within 0 to 10 degrees of X axis and <001> type of crystallographic direction is within 0 to 10 degrees of Y axis.

Further, 0 to 30% of crystallites can be randomly oriented.

An aluminum alloy with crystallographic texture has anisotropic properties. As an example, strength is one anisotropic property, but many other properties will also vary anisotropically. In this regard, the aluminum alloy has one or more high strength directions, which are directions in which the strength of the aluminum alloy is greater than the strength in at least one other direction. For example, the crystallographic directions <111>, <112>, and <110> are high strength directions of aluminum alloys. Thus, by orienting a certain volume fraction of crystallites in one or more of these high strength directions with respect to the predefined three-dimensional coordinate system 70, the strength (or other property) of the airfoil 60 can be tailored to enhance durability and/or performance of the airfoil 60.

In the illustrated example, the predefined three-dimensional coordinate system 70 is a Cartesian coordinate system having orthogonal X-, Y- and Z-axes. For purposes of this disclosure, the Z-axis extends along a radial direction of the airfoil body 62, which is perpendicular to the central engine axis A. The X-axis extends in a direction transverse to the first and second sides 66a/66b, and the Y-axis extends orthogonally to the Z- and X-axes. In one example, the Y-axis is parallel to the central engine axis A.

A volume fraction of the crystallites can be aligned such that one or more crystallographic directions of the aluminum alloy can be oriented with selected ones of the axes of the Cartesian coordinate system, within a cone (radius) of 10°. For example, as shown in FIG. 3, one or more of the above-described high-strength crystallographic directions is oriented within a cone of 10° radius of one or more of the axes of the three-dimensional coordinate system 70. Thus, the airfoil 60 can exhibit relatively high strength in the radial, axial and transverse directions.

In further examples, the controlled crystallographic texture can also define a texture distribution with respect to volume fractions of one or more different texture components. Such texture components and volume fractions can be determined by X-Ray or electron diffraction analysis, for example. In one example, the texture components distribution includes 20% to 100%, by volume, of a selected, defined texture, such as one of the high strength crystallographic directions.

In another example, the texture distribution includes 30% to 70%, by volume, of a first texture, the first texture component being defined by a {111} type of crystallographic plane being parallel within +/−10° of the X-Y, X-Z or Z-Y plane of the Cartesian coordinate system and a <1-10> type of crystallographic direction being oriented within a cone of 10° of one of the axes of the Cartesian coordinate system.

In a further example, the texture distribution also includes 30% to 70%, by volume, of a second texture, the second texture being defined by a {111} type of crystallographic plane being parallel within +/−10° of the X-Y, X-Z or Z-Y plane of the Cartesian coordinate system and a <−110> type of crystallographic direction being oriented within a cone of 10° of one of the axes of the Cartesian coordinate system. Thus, together, the first and second textures comprise 60% to 100% of the alloy volume.

In a further example of any of the foregoing examples, the texture distribution also includes less than 40%, by volume, of a third texture, the third texture being defined by a {100} type of crystallographic plane being parallel within +/−10° of the X-Y, X-Z or Z-Y plane of the Cartesian coordinate system and a <001> type of crystallographic direction being oriented within a cone radius of 10° of one of the axes of the Cartesian coordinate system.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An airfoil comprising:
an airfoil body extending at least between leading and trailing edges, first and second sides, and radially inner and outer ends, the airfoil body including an aluminum alloy having a controlled crystallographic texture with respect to a predefined three-dimensional coordinate system, wherein the controlled crystallographic texture defines a texture distribution with respect to volume fractions of textures.

2. The airfoil as recited in claim 1, wherein the three-dimensional coordinate system has an axis extending in a radial direction with respect to the radially inner and outer ends.

3. The airfoil as recited in claim 1, wherein the controlled crystallographic texture includes 20 to 100% of crystallites by volume oriented of a high strength crystal direction within 10° radius of an axis of the predefined three-dimensional coordinate system.

4. The airfoil as recited in claim 3, wherein the high strength crystal direction is selected from the group consisting of <111>, <112> and <110>.

5. The airfoil as recited in claim 1, wherein the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the controlled crystallographic texture includes an orientation of a selected crystal direction within a cone of 10° of the Z-axis.

6. The airfoil as recited in claim 5, wherein the selected crystal direction is selected from the group consisting of <111>, <112>, <110>, and combinations thereof.

7. The airfoil as recited in claim 1, wherein the predefined three-dimensional coordinate system is a Cartesian coordinate system having a Z-axis extending along a radial direction of the airfoil body, an X-axis extending in a direction traverse to the first and second sides, and a Y-axis extending orthogonally to the Z-axis and the X-axis, and the controlled crystallographic texture includes orientations of at least one of crystal directions <111>, <112> and <110> within 10° with respect to at least one of the axes of the Cartesian coordinate system.

8. The airfoil as recited in claim 1, wherein the texture distribution includes 20% to 100%, by volume, of a defined texture.

9. The airfoil as recited in claim 1, wherein the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the texture distribution includes 30% to 70%, by volume, of a first texture, the first texture being defined by a {111} type of crystallographic plane being parallel within +/−10° of the X-Y, X-Z or Z-Y plane of the Cartesian coordinate system and a <1-10> type of crystallographic direction being oriented within a cone of 10° of one of the axes of the Cartesian coordinate system.

10. The airfoil as recited in claim 9, wherein the texture distribution further includes 30% to 70%, by volume, of a second texture, the second texture being defined by a {111} type of crystallographic plane being parallel within +/−10° of the X-Y, X-Z or Z-Y plane of the Cartesian coordinate system and a <−110> type of crystallographic direction being oriented within a cone of 10° of one of the axes of the Cartesian coordinate system.

11. The airfoil as recited in claim 10, wherein the texture distribution further includes less than 40%, by volume, of a third texture, the third texture being defined by a {100} crystallographic plane being parallel within +/−10° of the X-Y, X-Z or Z-Y plane of the Cartesian coordinate system and a <001> crystallographic direction being oriented within a cone of 10° of one of the axes of the Cartesian coordinate system.

12. A gas turbine engine comprising:
a fan;
a compressor section;
a combustor in fluid communication with the compressor section; and
a turbine section in fluid communication with the combustor,
the fan including an airfoil having an airfoil body extending at least between a leading edge and a trailing edge, a first side and a second side, and a radially inner end and a radially outer end, the airfoil body including an aluminum-based metallic material having a controlled crystallographic texture with respect to a predefined three-dimensional coordinate system, wherein the controlled crystallographic texture includes an orientation of a high strength crystal direction within 10° of an axis of the predefined three-dimensional coordinate system and the controlled crystallographic texture defines a texture distribution with respect to volume fractions of texture components.

13. The gas turbine engine as recited in claim 12 wherein the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the controlled crystallographic texture includes an orientation of a selected crystal direction within a cone of 10° of the Z-axis.

14. The gas turbine engine as recited in claim 13, wherein the selected crystal direction is selected from the group consisting of <111>, <112>, <110>, and combinations thereof.

15. The gas turbine engine as recited in claim 12, wherein the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the controlled crystallographic texture includes orientations of at least one of crystal directions <111>, <112> and <110> within a cone of 10° with respect to at least one of the axes of the Cartesian coordinate system.

16. The gas turbine engine as recited in claim 12, wherein the texture components distribution includes 20% to 100%, by volume, of a defined texture.

17. The gas turbine engine as recited in claim 12, wherein the predefined three-dimensional coordinate system is a Cartesian coordinate system having a Z-axis extending along a radial direction of the airfoil body, a X-axis extending in a direction traverse to the first and second sides, and an Y-axis extending orthogonally to the Z-axis and the X-axis, and the texture component distribution includes:

30% to 70%, by volume, of a first texture components, the first texture component being defined by a {111} crystallographic plane of the crystallites in this component being parallel within +/−10° of the X-Y, X-Z or Z-Y plane of the Cartesian coordinate system and a <1-10> type of crystallographic direction of the crystallites in this component being oriented within a cone of 10° radius of one of the axes of the Cartesian coordinate system, 30% to 70%, by volume, of a second texture component, the second texture component being defined by a {111} crystallographic plane of the crystallites in this component being parallel within +/−10° of the X-Y, X-Z or Z-Y plane of the Cartesian coordinate system and a <−110> type of crystallographic direction of the crystallites in this component being oriented within a cone of 10° radius of one of the axes of the Cartesian coordinate system, and less than 40%, by volume, of a third texture component, the third texture component being defined by a {100} type of crystallographic plane of the crystallites in this component being parallel within +/−10° of the X-Y, X-Z or Z-Y plane of the Cartesian coordinate system and a <001> type of crystallographic direction of the crystallites in this component being oriented within a cone of 10° of one of the axes of the Cartesian coordinate system.

* * * * *